(12) United States Patent
Takeya et al.

(10) Patent No.: US 11,985,768 B2
(45) Date of Patent: May 14, 2024

(54) LAMINATED CIRCUIT BOARD

(71) Applicant: PI-CRYSTAL INCORPORATION, Chiba (JP)

(72) Inventors: Junichi Takeya, Chiba (JP); Seiichiro Yamaguchi, Chiba (JP); Masataka Itoh, Chiba (JP)

(73) Assignee: PI-CRYSTAL INCORPORATION, Chiba (JP)

( * ) Notice: Subject to any disclaimer, the term of this patent is extended or adjusted under 35 U.S.C. 154(b) by 329 days.

(21) Appl. No.: 16/450,459

(22) Filed: Jun. 24, 2019

(65) Prior Publication Data

US 2019/0313535 A1 Oct. 10, 2019

Related U.S. Application Data

(60) Division of application No. 15/676,472, filed on Aug. 14, 2017, now Pat. No. 11,122,693, which is a (Continued)

(30) Foreign Application Priority Data

Feb. 13, 2015 (JP) .................................. 2015-027013

(51) Int. Cl.
*H05K 1/14* (2006.01)
*H05K 1/02* (2006.01)
(Continued)

(52) U.S. Cl.
CPC ............ *H05K 3/361* (2013.01); *H05K 1/115* (2013.01); *H05K 1/116* (2013.01); *H05K 1/118* (2013.01);
(Continued)

(58) Field of Classification Search
CPC ...... H05K 3/1275; H05K 3/361; H05K 3/363; H05K 3/4038; H05K 3/4623;
(Continued)

(56) References Cited

U.S. PATENT DOCUMENTS 5,672,414 A 9/1997 Okamoto et al.
6,506,978 B1 1/2003 Furihata
(Continued)

FOREIGN PATENT DOCUMENTS

CN 1098588 2/1995
JP 3-069191 3/1991
(Continued)

OTHER PUBLICATIONS

G. Matijasevic, C. Gallagher and P. Gandhi, "High density multilayer substrates using patterned microvia interposers," 1998 IEEE Aerospace Conference Proceedings (Cat. No. 98TH8339), 1998, pp. 393-398 vol. 1, doi: 10.1109/AERO.1998.686936. (Year: 1998).*

(Continued)

*Primary Examiner* — A. Dexter Tugbang
(74) *Attorney, Agent, or Firm* — HSML P.C.

(57) ABSTRACT

Electronic devices to be integrated are formed on individual boards, the boards are laid to overlap each other in a predetermined relationship, and then through vias are formed at predetermined positions. With this, the electronic devices are electrically connected to each other, and function as an integrated device.

9 Claims, 5 Drawing Sheets

Related U.S. Application Data continuation of application No. PCT/JP2016/055734, filed on Feb. 12, 2016.

(51) Int. Cl.
| | | |
|---|---|---|
| *H05K 1/11* | (2006.01) | |
| *H05K 3/36* | (2006.01) | |
| *H05K 3/40* | (2006.01) | |
| *H05K 3/46* | (2006.01) | |
| *H01L 23/00* | (2006.01) | |
| *H05K 1/03* | (2006.01) | |
| *H05K 3/12* | (2006.01) | |

(52) U.S. Cl.
CPC ............ *H05K 1/144* (2013.01); *H05K 3/363* (2013.01); *H05K 3/403* (2013.01); *H05K 3/4038* (2013.01); *H05K 3/4623* (2013.01); *H05K 3/4635* (2013.01); *H05K 3/4691* (2013.01); *H01L 24/81* (2013.01); *H01L 24/91* (2013.01); *H05K 1/028* (2013.01); *H05K 1/0393* (2013.01); *H05K 3/1275* (2013.01); *H05K 2201/041* (2013.01); *H05K 2201/058* (2013.01); *H05K 2201/09181* (2013.01); *H05K 2201/09845* (2013.01); *H05K 2201/10121* (2013.01); *H05K 2201/10151* (2013.01); *Y10T 29/49124* (2015.01); *Y10T 29/49126* (2015.01)

(58) Field of Classification Search
CPC .... H05K 3/4635; H05K 3/4691; H05K 1/115; H05K 1/116; H05K 1/118; H05K 1/144; H05K 2201/041; H05K 2201/09845; H05K 2201/10121; H05K 2201/10151; H05K 1/11; H05K 2201/058; H05K 1/028; H05K 2201/09181; Y10T 29/49124; Y10T 29/49126; H01L 24/81; H01L 24/91
See application file for complete search history.

(56) References Cited

U.S. PATENT DOCUMENTS

| | | |
|---|---|---|
| 6,930,240 B1 | 8/2005 | Giboney et al. |
| 2002/0048916 A1 | 4/2002 | Yanagida |
| 2002/0177006 A1 | 11/2002 | Clothier et al. |
| 2003/0094697 A1 | 5/2003 | Higashida et al. |
| 2003/0224621 A1 | 12/2003 | Ostergard et al. |
| 2004/0156583 A1 | 8/2004 | Totani et al. |
| 2005/0079652 A1 | 4/2005 | Hasegawa et al. |
| 2005/0121225 A1 | 6/2005 | Hsu |
| 2006/0202349 A1 | 9/2006 | Higashida et al. |
| 2007/0148829 A1 | 6/2007 | Yoshino et al. |
| 2008/0017305 A1 | 1/2008 | Yeh et al. |
| 2008/0160196 A1 | 7/2008 | Kim et al. |
| 2008/0248258 A1 | 10/2008 | Hao |
| 2010/0163289 A1 | 7/2010 | Ito et al. |
| 2010/0307805 A1 | 12/2010 | Nakazawa et al. |
| 2011/0132642 A1* | 6/2011 | Shinoda ................ H05K 1/028 174/254 |
| 2013/0223034 A1* | 8/2013 | Rathburn ............... H05K 1/115 361/767 |
| 2014/0120401 A1* | 5/2014 | Shin ....................... H05K 1/118 429/123 |
| 2015/0327368 A1* | 11/2015 | Su .......................... H05K 1/118 174/254 |

FOREIGN PATENT DOCUMENTS

| | | | |
|---|---|---|---|
| JP | 09331153 A | * | 12/1997 |
| JP | 10-326970 | | 12/1998 |
| JP | 2000-277689 | | 10/2000 |
| JP | 2003-158346 | | 5/2003 |
| JP | 2005038951 A | * | 2/2005 |
| JP | 2006179589 A | * | 7/2006 |
| JP | 2007-088055 | | 4/2007 |
| JP | 2007173477 A | * | 7/2007 |
| JP | 2007-335675 | | 12/2007 |
| JP | 2008-071902 | | 3/2008 |
| JP | 2008147379 A | * | 6/2008 |
| JP | 2008-153441 | | 7/2008 |
| JP | 2008-258357 | | 10/2008 |
| JP | 2008-294337 | | 12/2008 |
| JP | 2014-212181 | | 11/2014 |

OTHER PUBLICATIONS

Machine Translation of Japanese Patent Publication, JP 2007-173477, Jun. 2022. (Year: 2022).*

Machine Translation of Japanese Patent Publication, JP 2006-179589, Mar. 2023. (Year: 2023).*

Machine Translation of Japanese Patent Publication, JP 9-331153, May 2023. (Year: 2023).*

Office Action issued in corresponding European Patent Application No. 16749345.1, dated Apr. 15, 2021, 6 pages.

Extended European Search Report issued in corresponding European Patent Application No. EP 16 74 9345, dated Sep. 17, 2018, 9 pages.

Office Action issued in corresponding Chinese Patent Application No. 201680008786.9, dated Apr. 30, 2019, 13 pages w/ translation.

* cited by examiner

LAMINATED CIRCUIT BOARD

TECHNICAL FIELD

The present invention relates to a flexible board on which circuits are formed, and particularly relates to a laminated circuit board in which circuits formed on a plurality of laminated circuit boards are connected to each other and function.

BACKGROUND ART

Printed electronics technology for forming electronic devices using printing techniques has been developed and established as a new industry. This technology is characterized in that a low-temperature process based on a printing technique is used to deposit a wiring material, an organic semiconductor material, and an insulating material, so that an electronic device that has the function of a circuit, a display, a sensor, or the like is formed on a soft and lightweight flexible board such as a plastic film. In addition, no vacuum apparatus or high-temperature device is needed during manufacturing, and thus there is an advantage in that the manufacturing cost is suppressed. In view of low costs and the functionality as being lightweight, soft, and the like, application to various fields and market expansion are expected.

Until now, as essential printed electronics technologies, various technologies including: wiring technology; display devices such as organic EL displays and electronic paper; organic EL lighting; battery technology; electronic device technology such as various types of sensors, and storage elements; and the like have been developed, and many of them have reached the practical level. On the other hand, these technologies are typically applied to a single device, and there has hardly been any effort to integrate various electronic devices on a flexible board. This is mainly attributed to the semiconductor technology.

Organic semiconductors have attracted attention as an important field in printed electronics technology, but a state in which, due to poor performance and material instability, practical use has not been achieved has continued for a long time. Meanwhile, a high-performance and stable organic semiconductor material and a deposition technique thereof have recently been developed, and research and development toward the practical use thereof has gradually gained traction.

In view of the above-described technical background, the possibility of integrating various printable electronic devices on a flexible board so that they operate at a practical level has increased. Hereafter, a technique for efficiently integrating printable electronic devices on a flexible board is desired.

Prior Art Document

Patent Document

Patent Document 1: JP 2000-277689A

DISCLOSURE OF INVENTION

Problem to be Solved by the Invention

If electronic devices having various functions are integrated on the same board, then the area of the integrated devices will increase and the yield ratio will greatly decrease. The present invention provides a highly productive technique of printable electronic device integration that is needed when a plurality of electronic devices are integrated on a flexible board.

Means for Solving Problem

The present invention is such that electronic devices that are to be integrated are formed on individual boards, and the boards are laid to overlap each other in a predetermined relationship, and then are electrically connected to each other, so as to be able to function as an integrated device.

Specifically, at least two circuit boards on which electronic devices are formed are laid to overlap each other partially or entirely, and at least one through-hole is formed in an overlapping region penetrating the plurality of circuit boards. Furthermore, this through-hole is filled with an electrically-conductive material, and a through-via that enables the circuit boards to be electrically connected is formed. On the other hand, if a circuit on each circuit board is laid out in advance so that a part thereof reaches a region in which the through-via is to be formed, then the part of the circuit can electrically be connected to the through-via. Accordingly, by laying out, in advance, portions of the circuits on the circuit boards that are desired to be connected to each other so that they are connected to the same one of through-vias, it is possible to realize an integrated device in which the circuits on the laminated circuit boards function.

Effects of the Invention

If a plurality of electronic devices are formed sequentially on one flexible board, typically, a yield ratio of each electronic device is multiplied, and therefore the yield ratio of the integrated device decreases. According to the present invention, individual good electronic devices are selected and laminated, and thus the problem that the yield ratio of the integrated device decreases can be prevented. In addition, it is possible to prevent the increase in the area when multiple electronic devices are integrated.

DESCRIPTION OF THE INVENTION

Figure 1A:
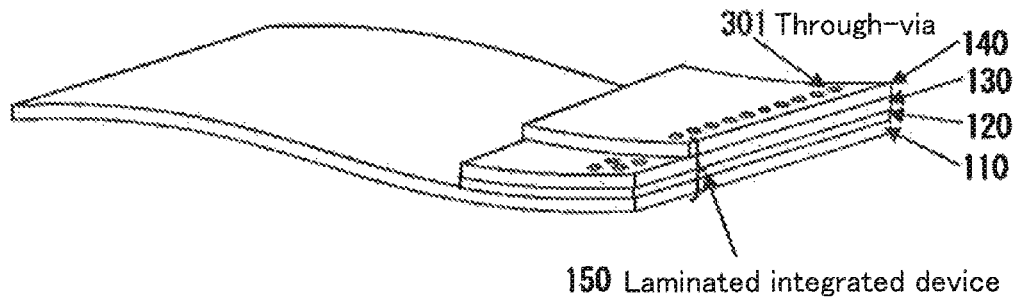
FIG. 1A is a perspective view illustrating a laminated integrated device 150 according to a first embodiment of the present invention. The laminated integrated device 150 is obtained by laminating circuit boards 110, 120, 130, and 140.
Figure 1B:
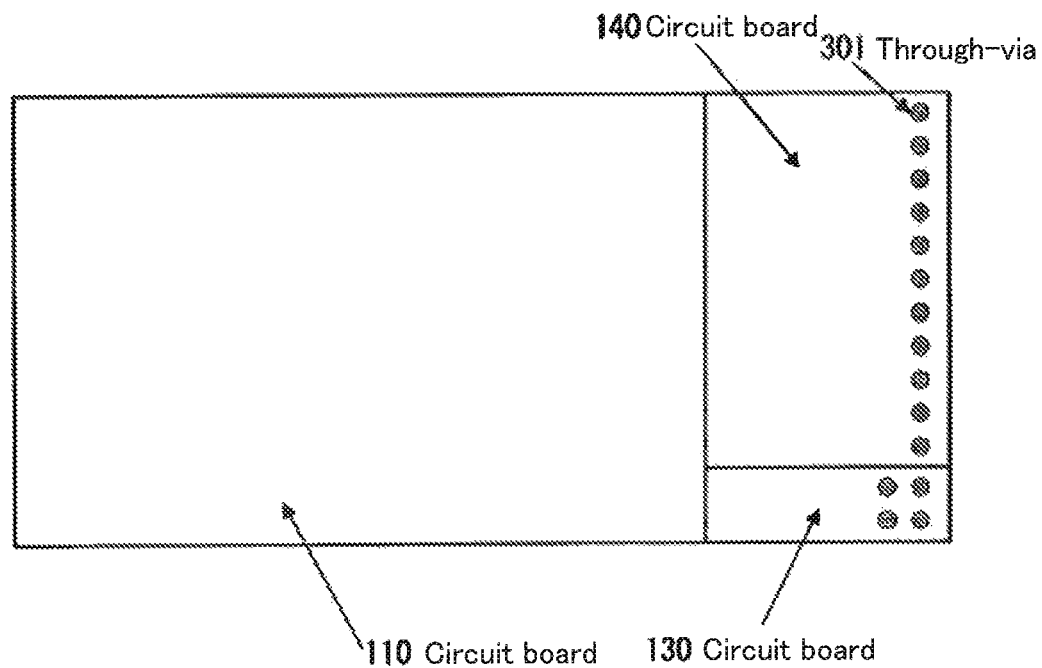
FIG. 1B is a top view of the laminated integrated device 150. Parts of the circuit boards 110 and 130, and the entire upper surface of the circuit board 140 are shown. The circuit board 120 is hidden by the circuit board 130 and cannot viewed. This figure also shows through-vias 301 for electrically connecting the circuit boards.
Figure 2A:
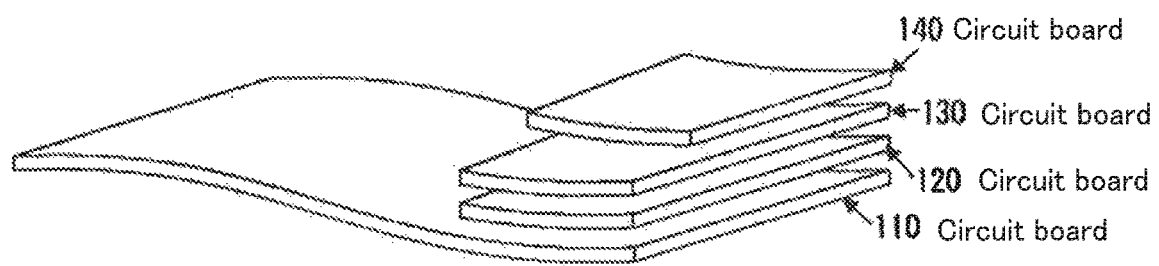
FIG. 2A is a diagram schematically illustrating a lamination process flow according to the first embodiment of the present invention, showing a situation in which the circuit boards 110, 120, 130, and 140 that are to be laminated are positioned in a predetermined positional relationship.
Figure 2B:
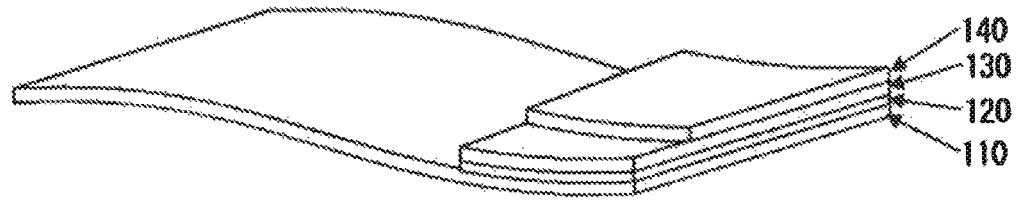
FIG. 2B is a diagram schematically illustrating the lamination process flow according to the first embodiment of the present invention, showing a state immediately after the laminated circuit boards 110, 120, 130, and 140 have been bonded to each other.
Figure 2C:
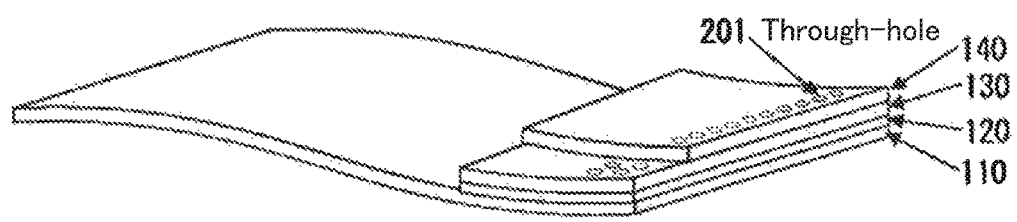
FIG. 2C is a diagram schematically illustrating the lamination process flow according to the first embodiment of the present invention, showing a state in which a plurality of through-holes 201 are formed in the bonded circuit boards at predetermined positions.
Figure 2D:
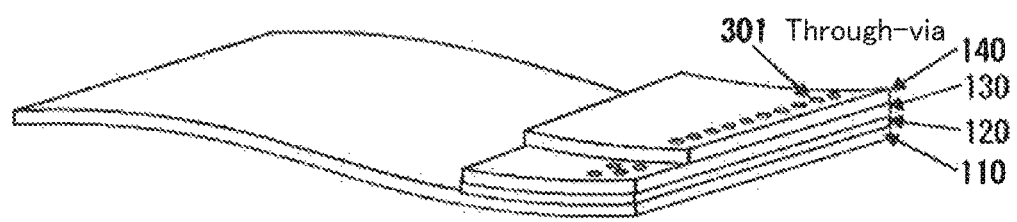
FIG. 2D is a diagram schematically illustrating the lamination process flow according to the first embodiment of the present invention, showing a state in which an electrically-conductive material is embedded in the through-holes 201 to form the through-vias 301.
Figure 3:
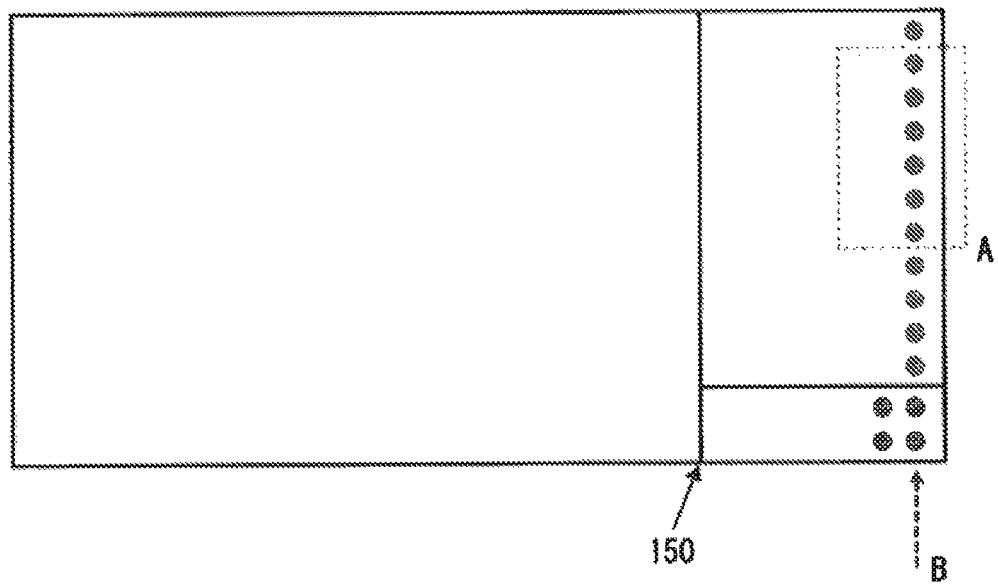
FIG. 3 is a diagram illustrating the laminated integrated device 150 according to the first embodiment of the present invention, showing a region A, which is a region on the laminated integrated device 150, and a direction B along which a cross section of the region A is taken, the region A and the direction B being referenced in the description below.

Hereinafter, embodiments of the present invention will be described in detail with reference to the drawings.

Embodiment 1

FIGS. 2A, 2B, 2C, and 2D schematically show the present invention in which circuit boards 110, 120, 130, and 140 are laminated, through-holes 201 are formed at predetermined positions penetrating all of the boards, and an electrically-conductive material is embedded in the through-holes to form through-vias 301 for electrically connecting circuits provided on the circuit boards.

In the present embodiment, four flexible boards are laminated, the four flexible boards including: the board 110 on which illuminance sensors for monitoring illuminance are arranged in a line; the board 140 on which a temperature sensor is formed; and the boards 120 and 130 that are two separate boards on which circuits for controlling the illuminance sensors and the temperature sensor are formed divided between the two. Within the application range of the present invention, the number of boards is not limited.

Figure 4:
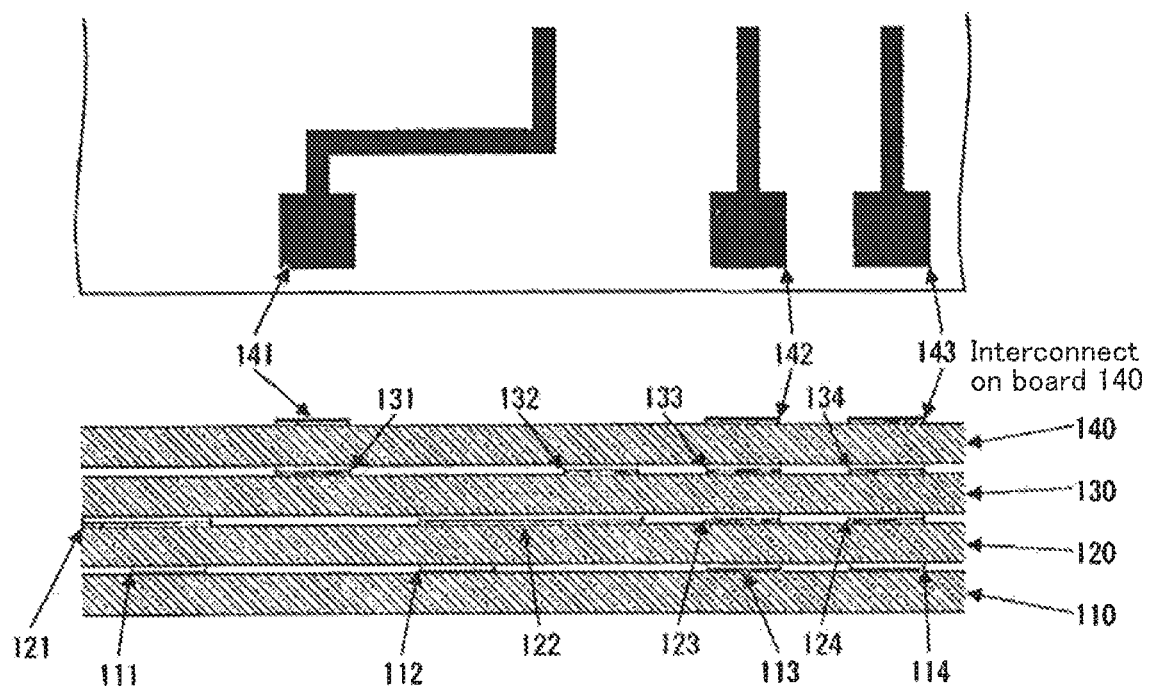
FIG. 4 illustrates a top view of the region A (upper figure) immediately after the circuit boards 110, 120, 130, and 140 are bonded to each other in the lamination process of the first embodiment of the present invention, and a cross-sectional view of the region A (lower figure) that is taken along B. In the figures, the reference numerals 111, 112, 113, and 114 denote interconnects on the circuit board 110, the reference numerals 121, 122, 123, and 124 denote interconnects on the circuit board 120, the reference numerals 131, 132, 133, and 134 denote interconnects on the circuit board 130, and the reference numerals 141, 142, and 143 denote interconnects on the circuit board 140.

FIG. 4 shows the four circuit boards immediately after they are bonded to each other, in a partial cross sectional view taken along a line (direction B) intersecting a row of the through-vias that are to be formed in the subsequent process, and in a top view thereof. Interconnects on the circuit boards are laid out in advance so that: in the range shown in this figure, interconnects 111 and 121 are connected to each other; interconnects 131 and 141 are connected to each other; interconnects 112, 122, and 132 are connected to each other; interconnects 113, 123, 133, and 142 are connected to each other; and interconnects 114, 124, 134, and 143 are connected to each other.

Circuits, which are however not shown, on the circuit boards are each made of a plurality of interconnect layers, and only the interconnects of the uppermost layer are shown. Within the application range of the present invention, a layout configuration is possible in which only one circuit interconnect layer is provided on the circuit board, or in which an intermediate layer of multilayer interconnects is connected to a through-via.

Figure 5:
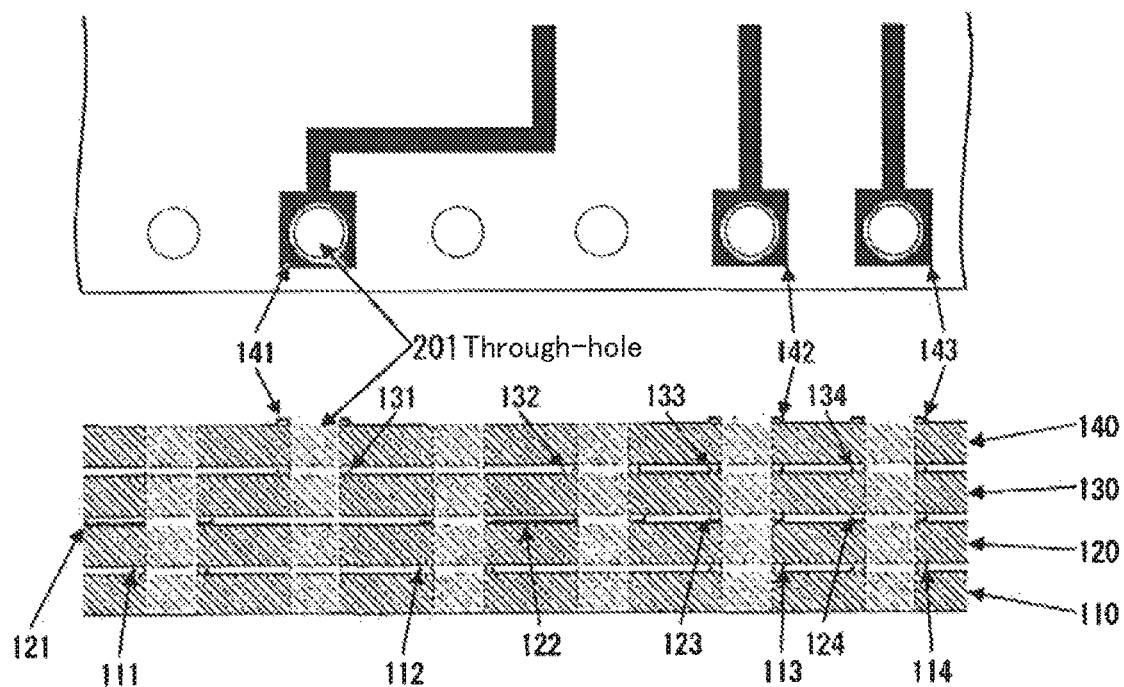
FIG. 5 illustrates a state immediately after the plurality of through-holes 201 are formed in the laminated circuit board obtained by bonding the circuit boards 110, 120, 130, and 140 to each other in the lamination process of the first embodiment of the present invention, with the upper figure showing a top view of the region A, and the lower figure showing a cross-sectional view of the region A taken along B.

FIG. 5 shows a cross sectional view and a top view of a part (region A) of the laminated circuit board immediately after the through-holes 201 are formed, at predetermined positions, in the laminated circuit board obtained by bonding the circuit boards 110, 120, 130, and 140 to each other. In the present embodiment, the through-holes are formed using a laser, but in the application range of the present invention, the means for forming the through-holes is not limited. Furthermore, in the figure, the through-holes are formed through the circuit board 110 of the lowermost layer as well, but the through-holes are not necessarily formed passing through the board of the lowermost layer.

Figure 6:
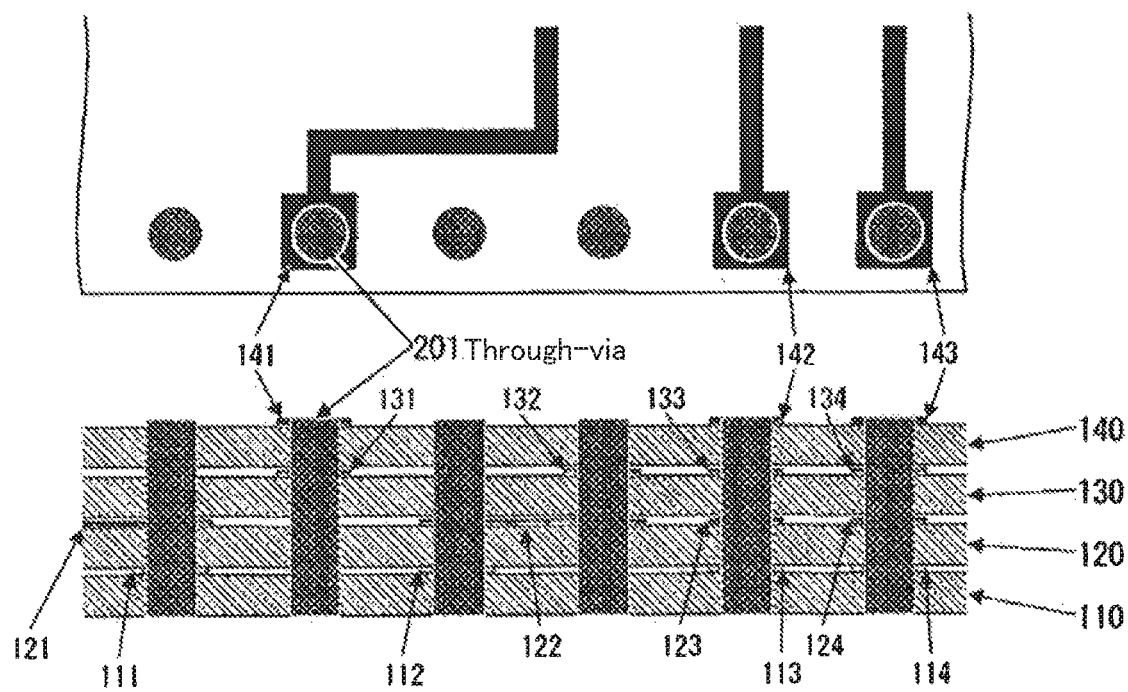
FIG. 6 illustrates a state immediately after the electrically-conductive material is embedded in the through-holes 201 and the through-vias 301 are formed in the lamination process of the first embodiment of the present invention, with the upper figure showing a top view of the region A, and the lower figure showing a cross-sectional view of the region A taken along B.

FIG. 6 shows a cross sectional view and a top view of a part (region A) of the laminated circuit board immediately after an electrically-conductive material is embedded in the through-holes 201 formed in the previous step and the through-vias 301 are formed. As a result of the through-vias 301 being formed, the circuits on the circuit boards 110, 120, and 130 are connected to each other at necessary contacts, and all of the laminated boards function as an integrated device.

In the present embodiment, an electroless plating method is used to embed gold to form the through-vias, but within the application range of the present invention, another method may also be used to embed another electrically-conductive material. Furthermore, it is not essential to completely fill the through-holes with an electrically-conductive material. It is also possible to form an electrically-conductive material layer only on side walls of the through-vias using a plating method or the like. It is possible to connect circuits on the circuit boards to each other at necessary positions using an electrically-conductive material in the through-vias, which is an object of the present patent application.

Furthermore, in the present embodiment, the through-vias formed in the through-holes are used to connect the circuits on the circuit boards to each other, but it is also possible to form notch-shaped or semicircular recesses at peripheral ends of the circuit boards, and to bring the electrically-conductive material into contact with the circuit boards along the recesses, so that the circuits on the circuit boards are connected to each other. The recesses may not necessarily be formed if a large contact surface can be ensured between the circuits on the circuit boards and the electrically-conductive material that connects the circuit boards.

Figure 7:
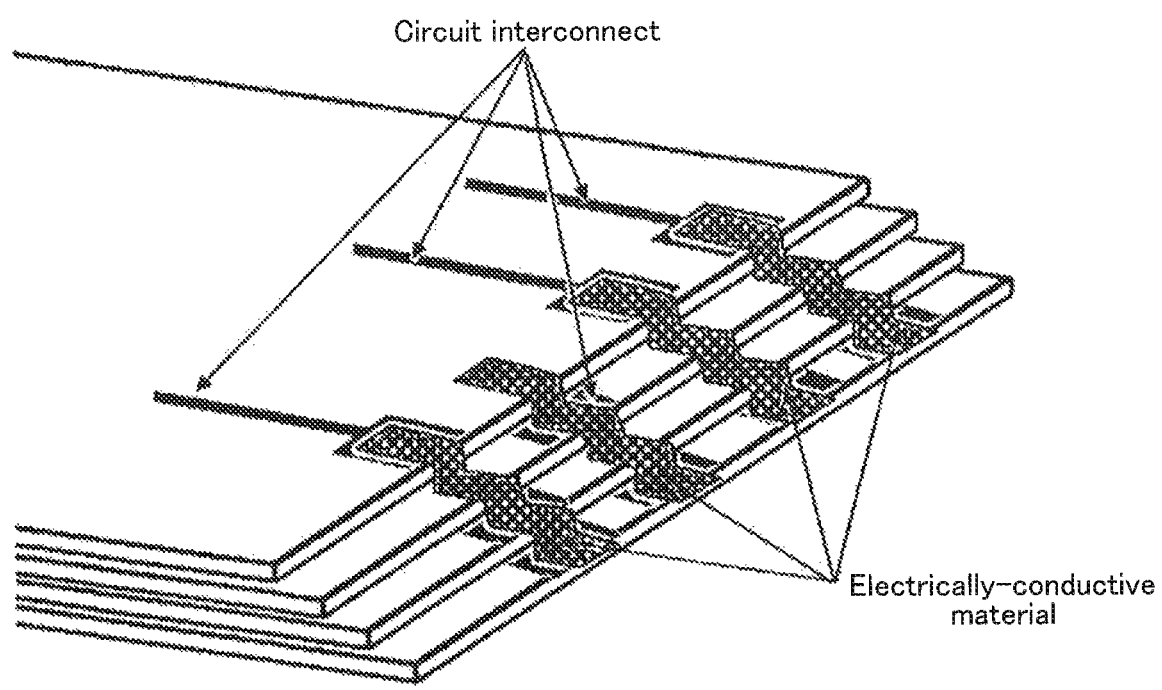
FIG. 7 is a schematic diagram illustrating an example of the present invention in which no through-via is used.

As a method for ensuring such a large contact surface, it is also advantageous that the circuit boards are laid to overlap each other while being shifted little by little. FIG. 7 is a perspective view schematically showing this state.

Embodiment 2

The forgoing first embodiment has described an example in which four circuit boards are laminated, but as an application of the present invention, it is also possible that, when a plurality of circuit boards are laminated, the circuit boards are bonded to each other while being classified into several groups, through-holes are formed in each group of laminated boards, then these groups of laminated boards are laid to overlap each other, and through-vias are formed. Furthermore, it is also conceivable that the present invention is applied to each group of laminated boards to subject the group of laminated boards to processing until the formation of through-vias, and then the groups of laminated boards are further laminated. In the latter case, all of the positions of the through-vias of the groups of laminated boards are not necessarily aligned, and the groups of laminated boards may be arranged so that only through-vias that need to be connected to each other overlap each other when all of the laminated boards are bonded to each other. This makes it possible for the entire integrated device to function.

Laminated circuit boards to which the present invention was applied are formed in advance. For example, a first laminated circuit board may be obtained by laminating two circuit boards, a second laminated circuit board may be obtained by laminating four circuit boards, and a third laminated circuit board may be obtained by laminating five circuit boards. These laminated circuit boards have through-vias. These through-vias are arranged so as to be connected to each other as appropriate when the three laminated circuit board are stacked together.

A laminated integrated device is obtained by laminating these three laminated boards.

Functions and Effects

The present embodiment relates to an integration of illuminance sensor arrays, a temperature sensor, and an organic semiconductor circuit, but if these are formed on the same flexible board, the area of the integrated devices increases, and thus the yield ratio greatly decreases. In the experiment, the yield ratio never exceeded 20%. When the present invention was applied, it was observed that a yield ratio of about 80% could be achieved.

The invention claimed is:

1. A laminated circuit board comprising:
a plurality of flexible circuit boards laminated one on top of another, wherein
on each respective one of the plurality of flexible circuit boards is formed an electronic component having a specific function,
in a planar view, each of the plurality of flexible circuit boards has at least one side and is arranged so that a region in a vicinity of the one side of a respective one of the flexible circuit boards overlaps with the region in a vicinity of the one side of each of the other respective flexible circuit boards so that the at least one of the flexible circuit boards is on top of the other flexible circuit board, an entirety of at least one of the plurality of flexible circuit boards overlaps another of the plurality of circuit boards, and the overlapping regions of the plurality of flexible circuit boards are oriented in a same direction, and
an electrical connection of a respective one of the plurality of flexible circuit boards with the at least one other of the plurality of flexible circuit boards is made via a through-via that is formed in the overlapping regions, or via an electrically-conductive material arranged on end faces of the flexible circuit boards.

2. The laminated circuit board according to claim 1, wherein at least one of the plurality of flexible circuit boards comprises any of an illuminance sensor, a temperature sensor, or a control circuit for controlling a sensor, as the electronic device.

3. The laminated circuit board according to claim 2, wherein at least one of the illuminance sensor, the temperature sensor, and the control circuit for controlling the sensors is an organic semiconductor circuit.

4. The laminated circuit board according to claim 1, wherein at least one of the flexible circuit boards has a smaller area than an area of the other flexible circuit boards.

5. The laminated circuit board according to claim 1, wherein the through-via formed in the flexible circuit boards is present, and a size of an opening of the through-via increases toward a top layer.

6. The laminated circuit board according to claim 1, wherein the overlapping regions of the plurality of flexible circuit boards are oriented in a same direction on a principal surface of each of the flexible circuit boards.

7. A laminated circuit board comprising:
a plurality of flexible circuit boards laminated one on top of another, wherein
on each respective one of the plurality of flexible circuit boards is formed an electronic component having a specific function,
in a planar view, each of the plurality of flexible circuit boards has at least one side and is arranged so that a region in a vicinity of the one side of a respective one of the flexible circuit boards overlaps with the region in a vicinity of the one side of each of the other respective flexible circuit boards so that the at least one of the flexible circuit boards is on top of the other flexible circuit board, an entirety of at least one of the plurality of flexible circuit boards overlaps another of the plurality of circuit boards, and the overlapping regions of the plurality of flexible circuit boards are oriented in a same direction, and
the laminated circuit board as a whole functions as an integrated device.

8. The laminated circuit board according to claim 7, wherein
the electronic component on at least one of the plurality of flexible circuit boards is any of an illuminance sensor, a temperature sensor, or a control circuit for controlling a sensor, and
the flexible circuit boards provided with the electronic component function as an illuminance sensor device, a temperature sensor device, or a control circuit device.

9. The laminated circuit board according to claim 8, wherein at least one of the illuminance sensor, the temperature sensor, and the control circuit for controlling the sensors is an organic semiconductor circuit.

* * * * *